United States Patent
Tseng et al.

(10) Patent No.: US 7,449,697 B2
(45) Date of Patent: Nov. 11, 2008

(54) ORGANIC ELECTROLUMINESCENT DEVICES AND FABRICATION METHODS THEREOF

(75) Inventors: Chang-Ho Tseng, Sinwu Township, Taoyuan County (TW); Du-Zen Peng, Chubei (TW); Yaw-Ming Tsai, Wurih Township, Taichung County (TW)

(73) Assignee: TPO Displays Corp., Chu-Nan (TW)

( * ) Notice: Subject to any disclaimer, the term of this patent is extended or adjusted under 35 U.S.C. 154(b) by 347 days.

(21) Appl. No.: 11/326,247

(22) Filed: Jan. 4, 2006

(65) Prior Publication Data

US 2007/0152180 A1    Jul. 5, 2007

(51) Int. Cl.
F21V 9/16 (2006.01)
(52) U.S. Cl. .................................... 250/458.1
(58) Field of Classification Search ............... 250/458.1
See application file for complete search history.

(56) References Cited

U.S. PATENT DOCUMENTS

| | | | |
|---|---|---|---|
| 7,122,835 B1 * | 10/2006 | Ikeda et al. ................... 257/72 |
| 2001/0028060 A1 | 10/2001 | Yamazaki et al. | |
| 2001/0055008 A1 | 12/2001 | Young et al. | |
| 2003/0063081 A1 | 4/2003 | Kimura et al. | |
| 2004/0197971 A1 * | 10/2004 | Yamazaki et al. ........... 438/164 |
| 2005/0035932 A1 | 2/2005 | Nishikawa et al. | |
| 2006/0030084 A1 * | 2/2006 | Young ........................ 438/149 |

FOREIGN PATENT DOCUMENTS

| | | |
|---|---|---|
| CN | 1300105 | 6/2001 |
| CN | 1678952 | 10/2005 |
| WO | WO2004019123 | 3/2004 |
| WO | WO2004109641 | 12/2004 |

OTHER PUBLICATIONS

"Invited Paper: A Comparison of Pixel Circuits for Active Matrix Polymer/Organic LED Displays" Fish et al.; 2002; pp. 968-971.
"Improved Optical Feedback for AMOLED Display Differential Ageing Compensation" Fish et al.; 2004; pp. 1120-1123.
"Optical Feedback for AMOLED Display Compensation Using LTPS and a-Si:H Technologies" Fish et al.; 2005; pp. 1340-1343.
CN Office Action mailed Apr. 11, 2008.

* cited by examiner

*Primary Examiner*—David P. Porta
*Assistant Examiner*—Marcus H Taningco
(74) *Attorney, Agent, or Firm*—Thomas, Kayden, Horstemeyer & Risley

(57) ABSTRACT

Organic electroluminescent devices are disclosed. A representative device incorporates a substrate that comprises a control area and a sensitive area. A switch device and a driving device are disposed overlying the control area. A photo sensor is disposed overlying the sensitive area. An OLED element is disposed in the sensitive area and illuminating to the photo sensor. A capacitor is coupled to the photo sensor and the driving device, wherein a photo current corresponding to the brightness of the OLED element is generated in the photo sensor responsive to the OLED element illuminating the photo sensor such that a voltage of the capacitor is adjusted by the photo current to control the current passing through the driving device, thus changing the illumination of the OLED element.

19 Claims, 17 Drawing Sheets

ORGANIC ELECTROLUMINESCENT DEVICES AND FABRICATION METHODS THEREOF

BACKGROUND

Organic electroluminescent devices are also known as organic light emitting diodes (OLEDs). The OLED luminescent principle applies a voltage to organic molecular material or polymer material, and the device luminesces. Due to self emission characteristics of the OLED, dot matrix type displays have been produced that exhibit light weight, slim profile, high contrast, low power consumption, high resolution, fast response time, no need for backlighting, and full viewing angle. Possible display parameters range from 4 mm microdisplay to 100 inch outdoor billboards and make it a preferred type of flat panel display (FPD). Referring to FIG. 1, an organic electroluminescent device is operated by a switch transistor 102, and a driving transistor 104 coupled to a power line Vp. Organic electroluminescent devices 106 typically, however, suffer from non-uniform brightness between pixels. Specifically, brightness decays when the organic electroluminescent device 106 is operated for a long period of time.

SUMMARY

Organic electroluminescent devices and fabrication methods are provided. In this regard, an embodiment of an organic electroluminescent device comprises a substrate that comprises a control area and a sensitive area. A switch device and a driving device are disposed overlying the control area. A photo sensor is disposed overlying the sensitive area. An OLED element is disposed in the sensitive area and illuminating to the photo sensor. A capacitor is coupled to the photo sensor and the driving device, wherein a photo current corresponding to a brightness of the OLED element is generated in the photo sensor responsive to the OLED element illuminating the photo sensor such that a voltage of the capacitor is adjusted by the photo current to control the current passing through the driving device, thus changing the illumination of the OLED element.

Another embodiment of an organic electroluminescent device comprises: a substrate comprising a control area and a sensitive area; a switch device and a driving device overlying the control area; a photo sensor overlying the sensitive area; an OLED element disposed in the sensitive area and operative to illuminate the photo sensor; and a capacitor coupled to the photo sensor and the driving device. A photo current corresponding to a brightness of the OLED element is generated in the photo sensor responsive to the OLED element illuminating on the photo sensor such that a the voltage of the capacitor is adjusted by the photo current to control the current passing through the driving device, thus changing the illumination of the OLED element. The switch device is a top gate transistor, and the photo sensor is a bottom gate transistor.

An embodiment of a method for forming an organic electroluminescent device comprises: providing a substrate comprising a control area and a sensitive area; forming an active layer overlying the control area of the substrate; forming a gate dielectric layer overlying the active layer and the sensitive area of the substrate; forming a conductive layer on the gate dielectric layer; patterning the conductive layer to form first and second gates in the control area, and a third gate in the sensitive area; forming a dielectric layer at least covering the first, second, and third gates; forming a photo sensor active layer on a portion of the dielectric layer overlying the sensitive area; forming a photo sensor doped layer on the photo sensor active layer; forming a photo sensor source and a photo sensor drain electrically connecting opposite sides of the photo sensor doped layer respectively; and forming an OLED element overlying a portion of the control area and the sensitive area.

DESCRIPTION OF THE DRAWINGS

The invention can be more fully understood by reading the subsequent detailed description and examples with references made to the accompanying drawings, wherein.

DETAILED DESCRIPTION

Figure 1:
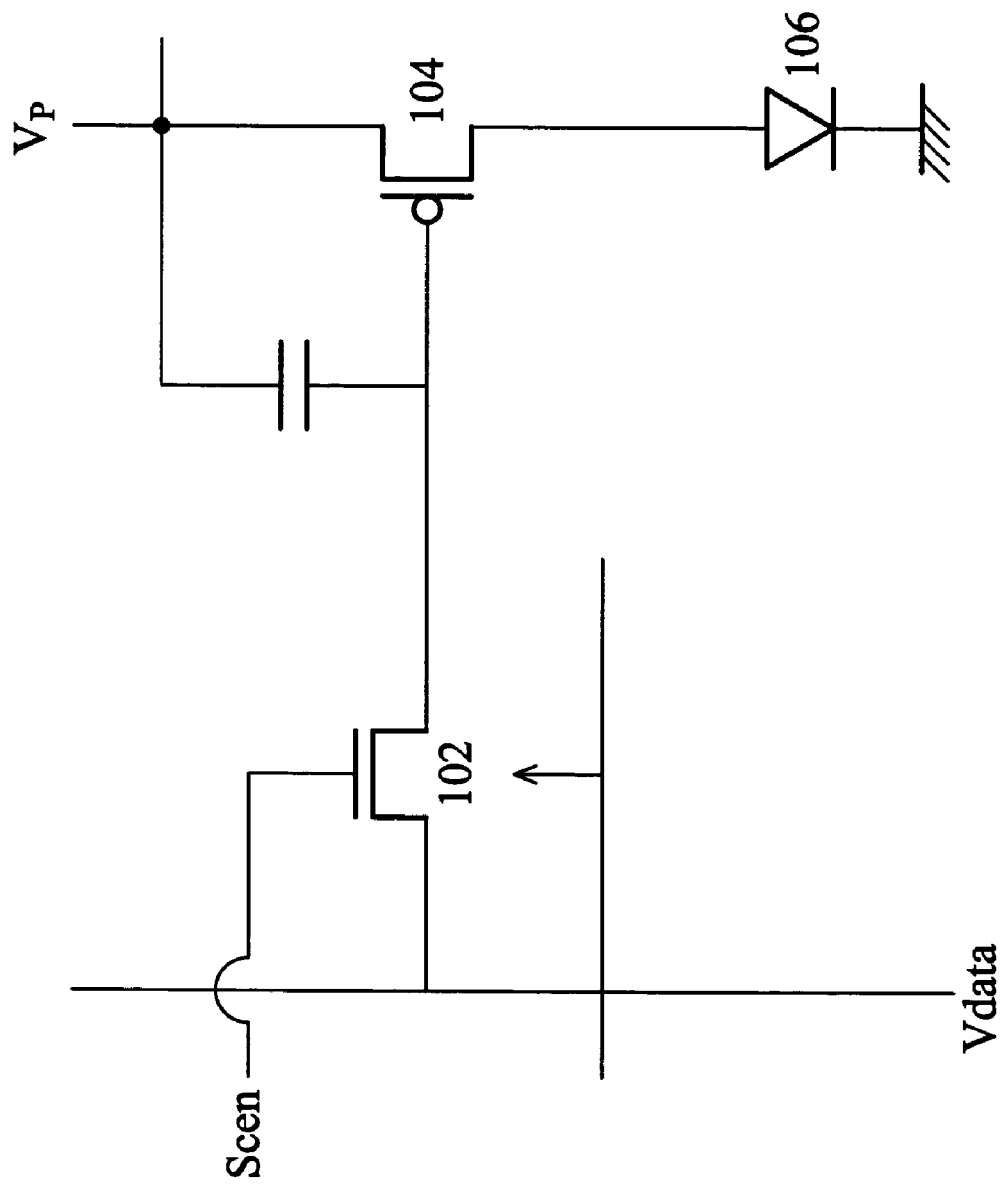
FIG. 1 illustrates a conventional organic electroluminescent device.

Exemplary embodiments of the invention will be described in greater detail by referring to the drawings. It is noted that in the accompanying drawings, like and/or corresponding elements are referred to by like reference numerals.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more layers.

Figure 2:
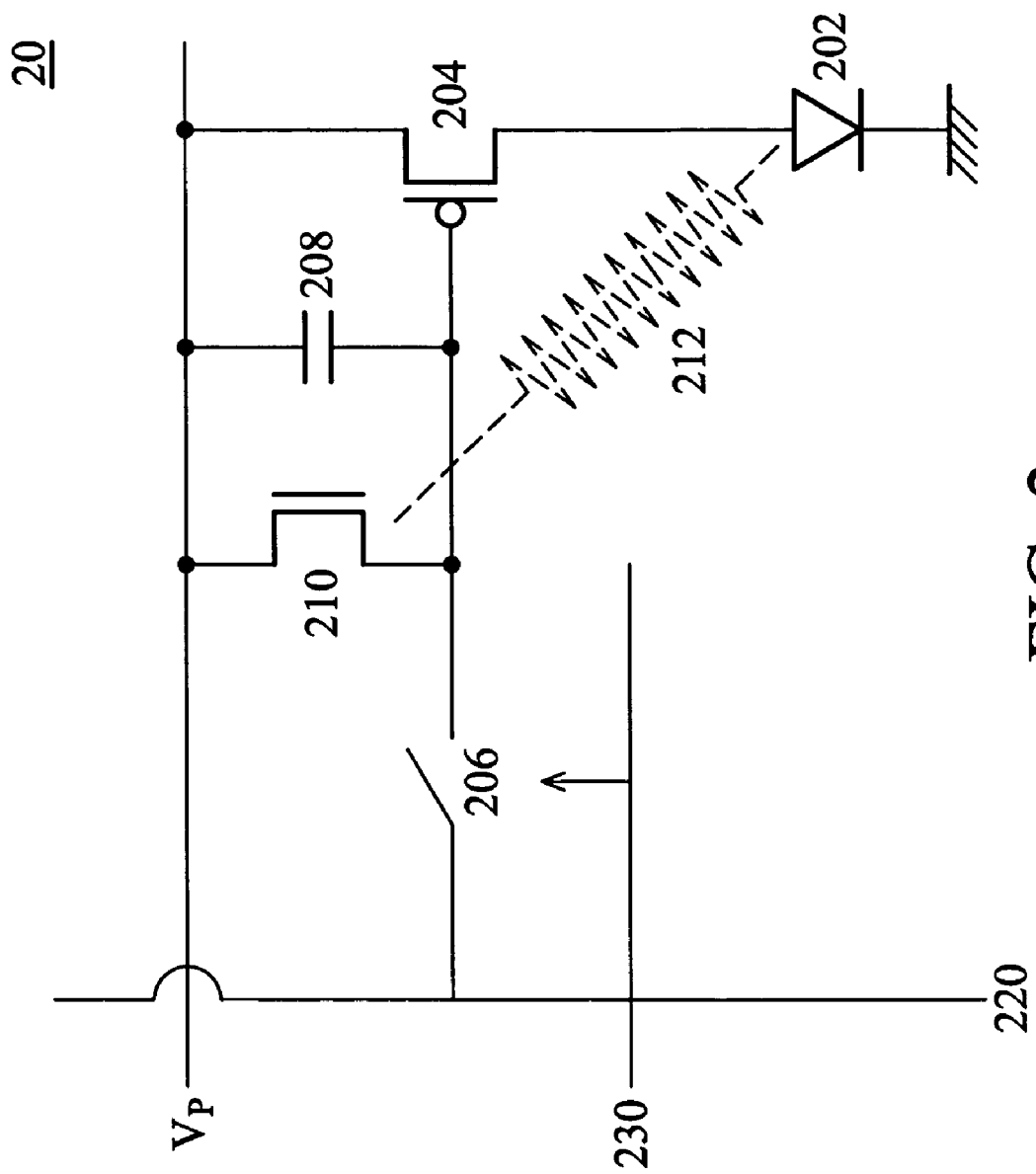
FIG. 2 shows an organic electroluminescent device with compensation device in accordance with an embodiment of the invention.

FIG. 2 shows an organic electroluminescent device with compensation device in accordance with an embodiment of the invention. Referring to FIG. 2, the electroluminescent device includes a pixel element 20. In the pixel element 20, an organic electroluminescent element 202 is operated by a switch device 206, such as switch integrated circuit (IC) or switch transistor. Pixel element 20 also includes a driving device 204 coupled to a power line Vp, also referred to as a driving integrated circuit (driving IC), in which current passing through the driving device 204 is controlled to determine illumination of the organic electroluminescent element 202. The switch device 206 is controlled by a column data line 220 and a row word line 230. As in this embodiment, an optional capacitor 208 can be coupled to a gate electrode of the driving device 204, in which the capacitor 208 further couples to a photo sensor 210. Voltage of the capacitor 208 is adjusted to control the current passing through the driving transistor 204 according to illumination of the organic electroluminescent element 202 detected by the photo sensor 210. Thus, illumination of the organic electroluminescent element 202 is changed for compensation. FIG. 3N shows a cross-sectional view of a pixel element 20 of an organic electroluminescent device of an embodiment of the present invention. FIG. 3A~FIG. 3M show intermediate cross sections of this embodiment of the organic electroluminescent device.

Figure 3A:
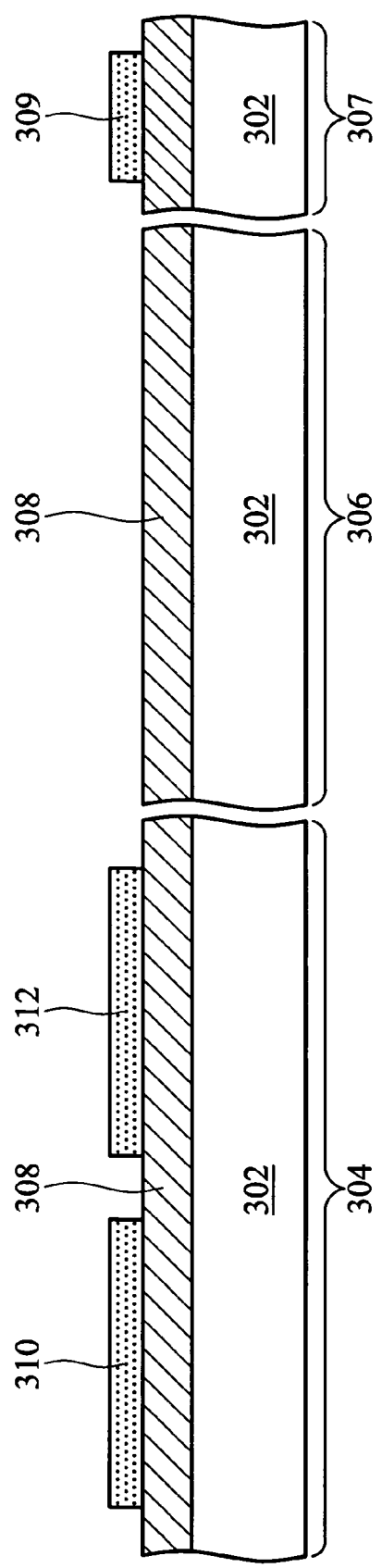
FIG. 3A~FIG. 3N show cross sections of an embodiment of an organic electroluminescent device with compensation device during fabrication.

Referring to FIG. 3A, a substrate 302 comprising a control area 304, a sensitive area 306 and a capacitor area 307 is provided. A buffer layer 308 is formed on the substrate 302. The buffer layer 308 can comprise silicon oxide, silicon nitride, silicon oxynitride or a combination thereof, and preferably is a stack of a silicon oxide layer and a silicon nitride layer. Preferably, thickness of the silicon nitride layer is about 350 Å~650 Å, and thickness of the silicon oxide layer is about 1000 Å~1600 Å.

A conductive layer (not shown) is formed on the buffer layer 308. The conductive layer can comprise polysilicon. For example, an amorphous silicon layer is first formed by deposition with chemical vapor deposition and then crystallized or annealed with an excimer laser (ELA) to form a polysilicon layer. The conductive layer is defined by lithography and etched to form a first active layer 310, a second active layer 312 overlying the control area 304 of the substrate, and a bottom electrode 309 overlying the capacitor area 307 of the substrate 302, in which the conductive layer overlying the sensitive area 306 is removed.

Figure 3B:
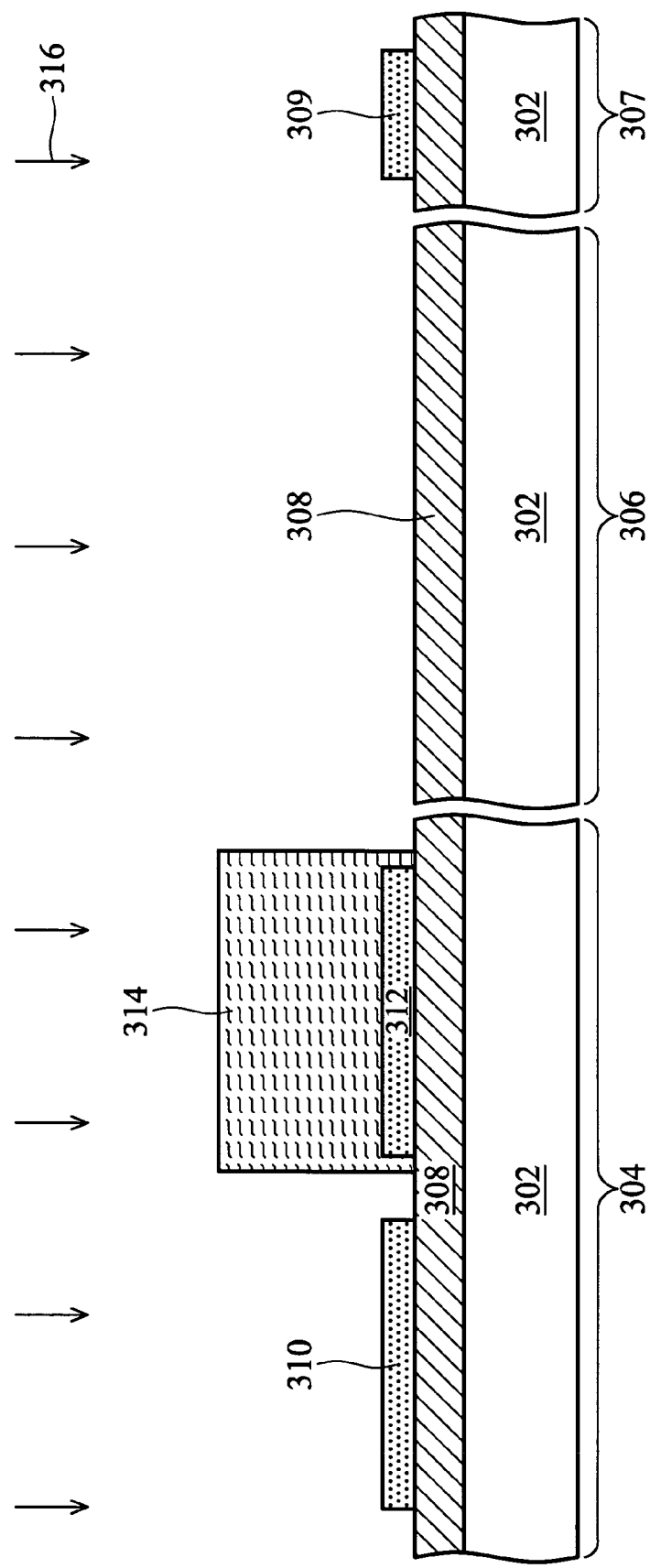

Referring to FIG. 3B, the second active layer 312 is covered by a photoresist layer 314 to channel dope dopant 316 into the first active layer 310. The dopant 316 preferably comprises B+, and the dosage is typically about 0~1E13/cm2.

Figure 3C:
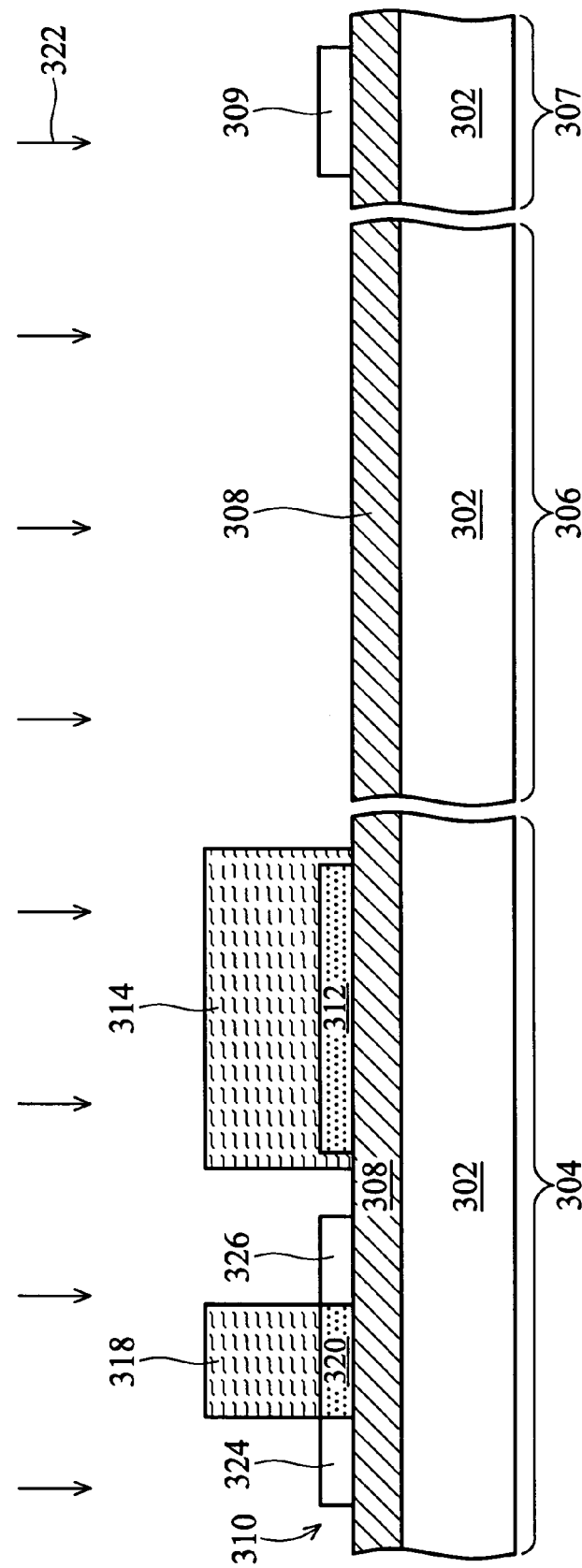

Referring to FIG. 3C, a channel region 320 of the first active layer 310 is covered by another photoresist layer 318, implanting N+ ions 322 into the first active area to form a source 324 and a drain 326 of an n type transistor. In a preferred embodiment of the invention, the N+ ions comprise phosphorous, and the dosage is preferably about 1E14~1E16cm2.

Figure 3D:
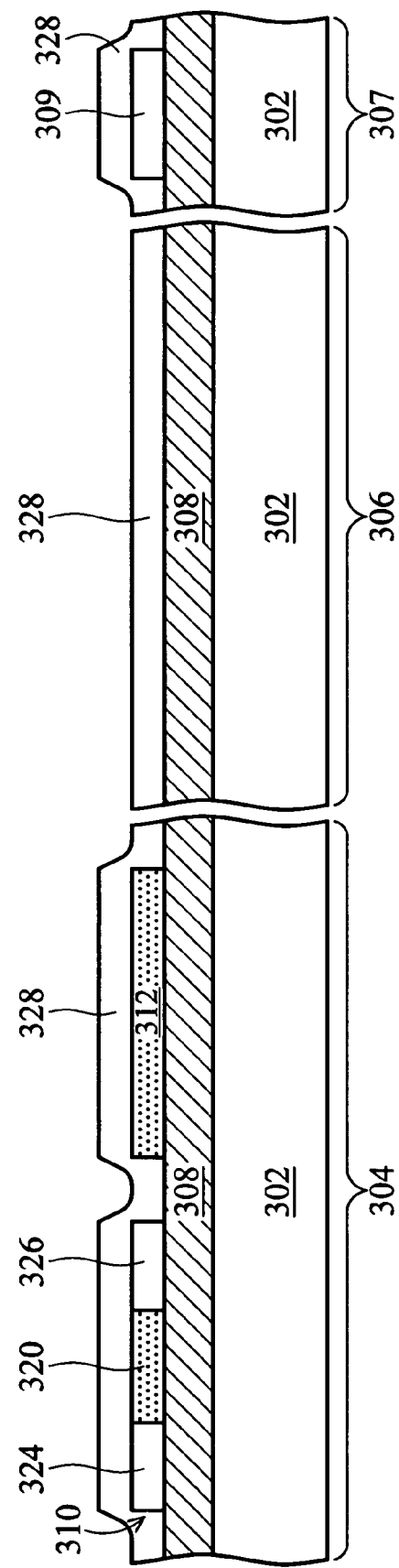

Referring to FIG. 3D, the photoresist layers 314 and 318 are removed. A gate dielectric layer 328, for example silicon oxide, silicon nitride, silicon oxynitride, a combination thereof, a stack layer thereof or other high K dielectric material, is blanketly deposited on the first active layer 310, the second active layer 312 and the buffer layer 308, and the bottom electrode layer 309 in the capacitor area 307. Note that the gate dielectric layer 328 serves as a capacitor dielectric layer in the capacitor area 307.

Figure 3E:
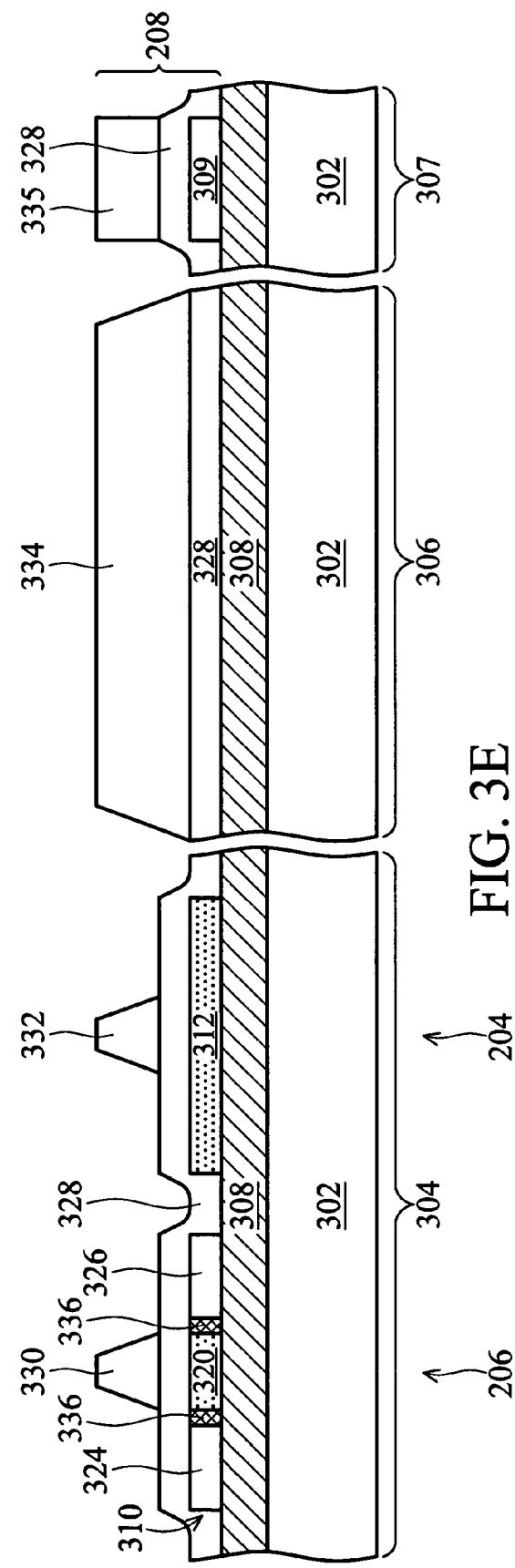

Referring to FIG. 3E, a gate conductive layer (not shown), for example doped polysilicon or metal, is formed on the gate dielectric layer 328. In a preferred embodiment of the invention, the gate conductive layer is Mo and about 1500 Å~2500 Å thick.

Next, the gate conductive layer is patterned by lithography and etched to form an n type transistor gate 330 overlying the first active layer 310, a p type transistor gate 332 overlying the second active layer 312, a photo sensor gate 334 on the gate dielectric layer 328 overlying the sensitive region 306, and a top electrode 335 overlying the capacitor area 307. Thus, the bottom electrode 309, the gate dielectric layer 328, and the top electrode 335 constitute the capacitor 208 as shown in FIG. 2.

Figure 3F:
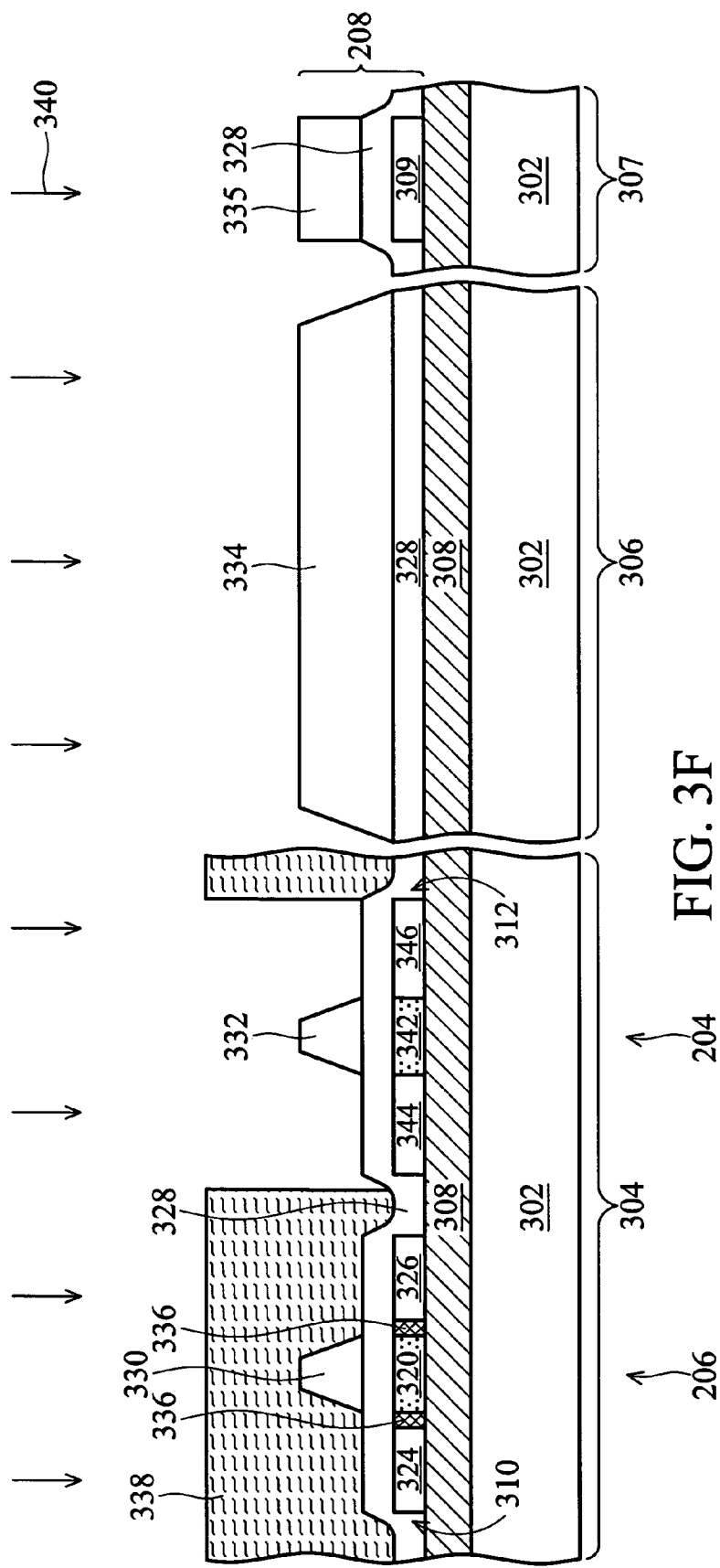

In a preferred embodiment of the invention, subsequent to formation of the gate 330, 332 and 334, a light doping step, for example ion implantation, can be performed to form lightly doped source/drain (LDD) 336 on opposite sides of the channel region 320 of the first active layer 310 of the n type transistor. Thus, the switch device 206 of n type and the driving device 204 of p type as shown in FIG. 2 are formed in the control area 304. According to some embodiments of the present invention, the switch device 206 and the driving device 204 are top gate transistors. In FIG. 3F, a photoresist layer 338 is formed to cover the first active layer 310, and an ion implantation 340 is performed to form source 344 and drain 346 on opposite sides of the channel region 342 of the p type transistor. In these ion implantation steps, due to coverage of the photo sensor gate 334, the layers thereunder are not doped.

Figure 3G:
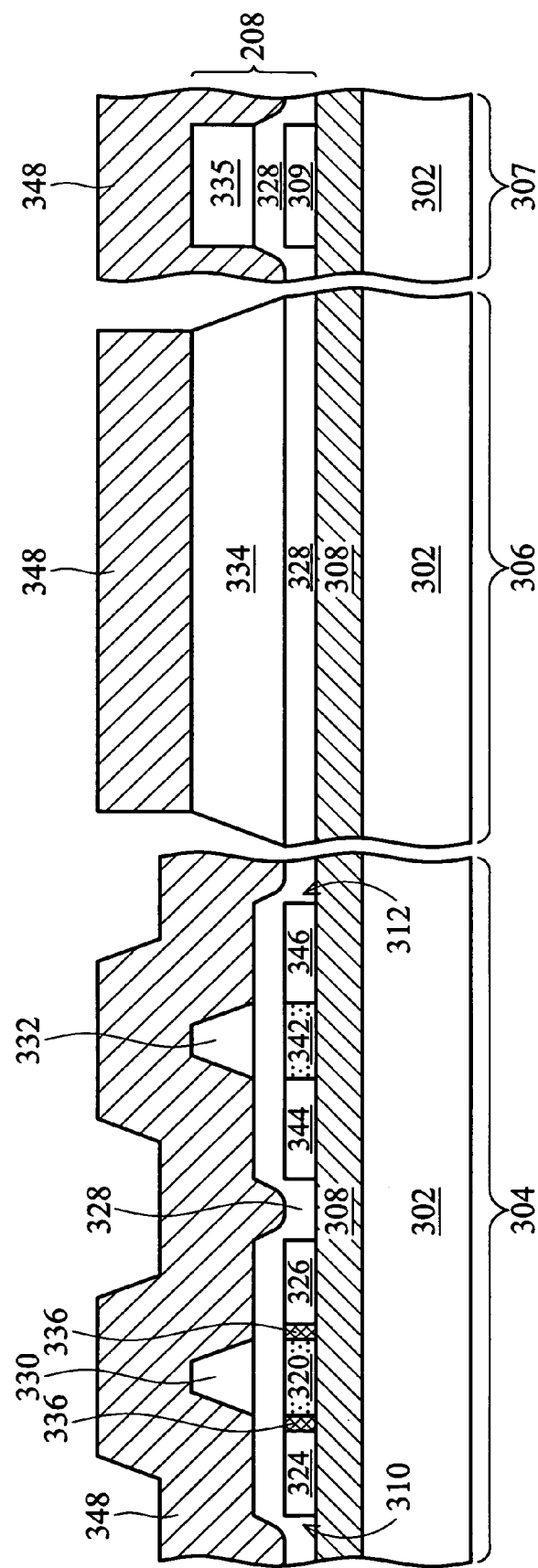

Referring to FIG. 3G, the photoresist layer 338 is removed, and a dielectric layer 348 is blanketly deposited on the gate dielectric layer 328 overlying the control area 304, n type transistor gate 330, the p type transistor gate 332, the photo sensor gate 334 overlying the sensitive area 306, and the top electrode 335 overlying the capacitor area 307. A portion of the dielectric layer 348 overlying the control area 304 can act as an inter-metal dielectric layer of control devices, for example n type transistor and/or p type transistor, and another portion overlying the sensitive area 306 can act as a gate dielectric layer of a photo sensor.

Generally, thickness and composition of the dielectric layer 348 can be determined according to product specifications or process window. For example, the dielectric layer 348 may include silicon dioxide, polyimide, spin-on-glass (SOG), fluoride-doped silicate glass (FSG), Black Diamond (a product of Applied Materials of Santa Clara, Calif.), Xerogel, Aerogel, amorphous fluorinated carbon, and/or other materials. In a preferred embodiment of the invention, the dielectric layer 348 is a stack layer of silicon oxide and silicon nitride, and more preferably a lower nitride layer/oxide layer/higher nitride layer structure, in which the lower nitride layer is about 2500~3500 Å thick, the oxide layer is about 2500~3500 Å thick and the higher nitride layer is about 500~1500 Å thick.

Figure 3H:
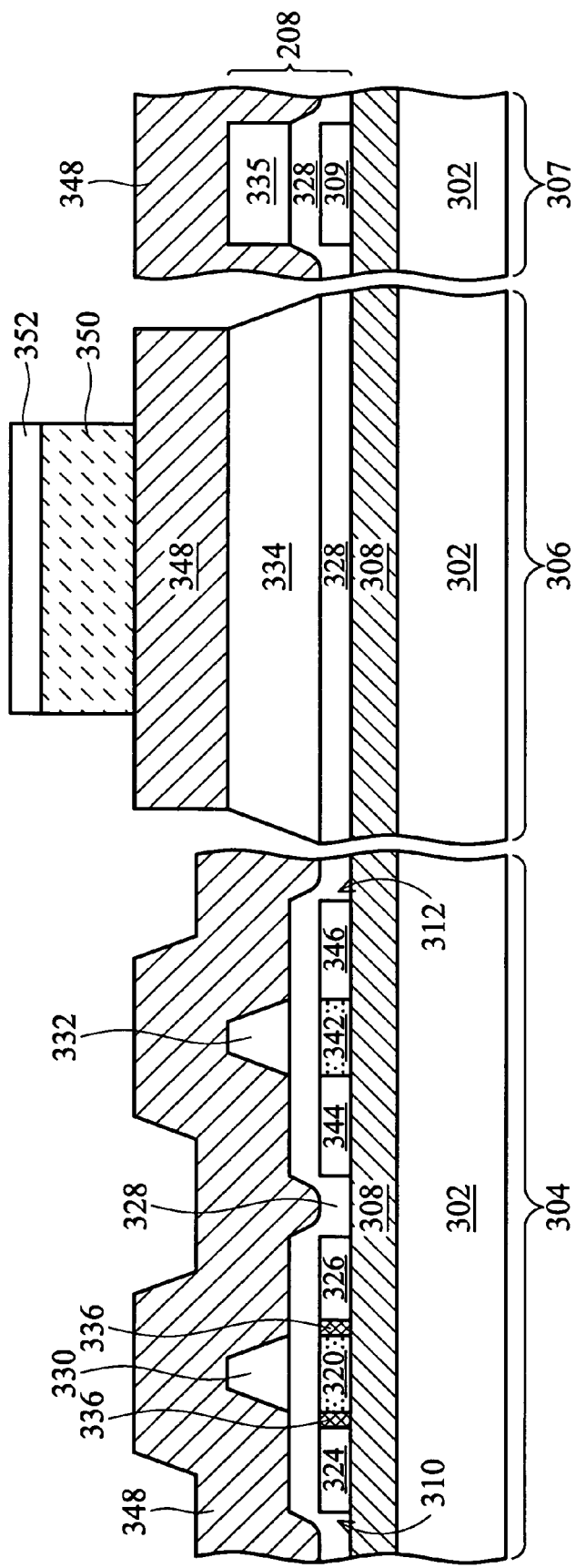

Referring to FIG. 3H, a photo sensor active layer 350 and a photo sensor doped layer 352 are formed on a portion of the dielectric layer 348 overlying the sensitive area 306. The photo sensor active layer 350 may include an elementary semiconductor, such as crystal silicon, amorphous silicon, and/or polysilicon. In some embodiments, the photo sensor active layer 350 can be an amorphous silicon layer. In this way, the photo sensor active layer 350 will be more sensitive when illuminated by an OLED element to be formed thereon afterwards.

The photo sensor doped layer 352 can be a doped layer with the material of the photo sensor active layer 350 as a bulk material. In a preferred embodiment of the invention, the photo sensor active layer 350 is undoped amorphous silicon and the photo sensor doped layer 352 is amorphous silicon doped with N+ ions, such as phosphorous, and more preferably the photo sensor active layer 350 is about 1000 Å~10000 Å thick, the photo sensor doped layer 352 is about 100 Å~1000 Å thick.

Figure 3I:
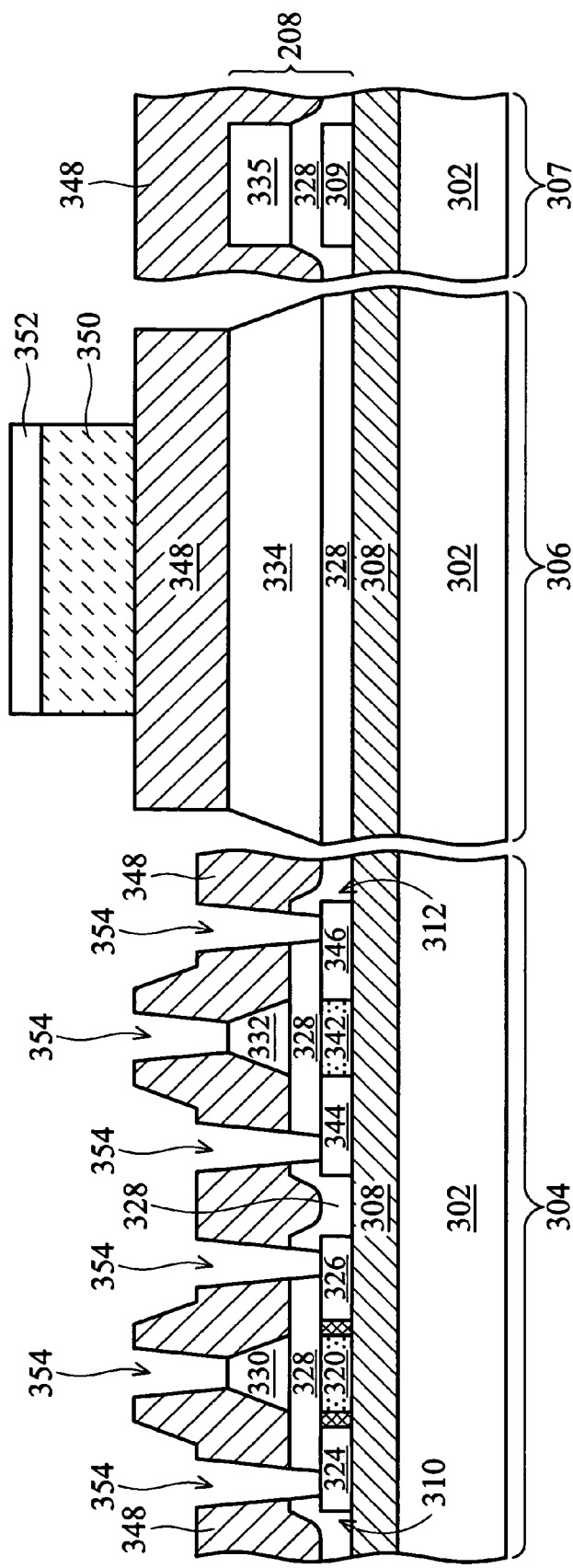

Referring to FIG. 3I, the dielectric layer 348 and the gate dielectric layer 328 are patterned by lithography and etched to form a plurality of openings 354. Thus, exposes the source 324, gate 330 and drain 326 of the n type transistor and the source 344, gate 332 and drain 346 of the p type transistor respectively for connection to metal lines in subsequent processes.

Figure 3J:
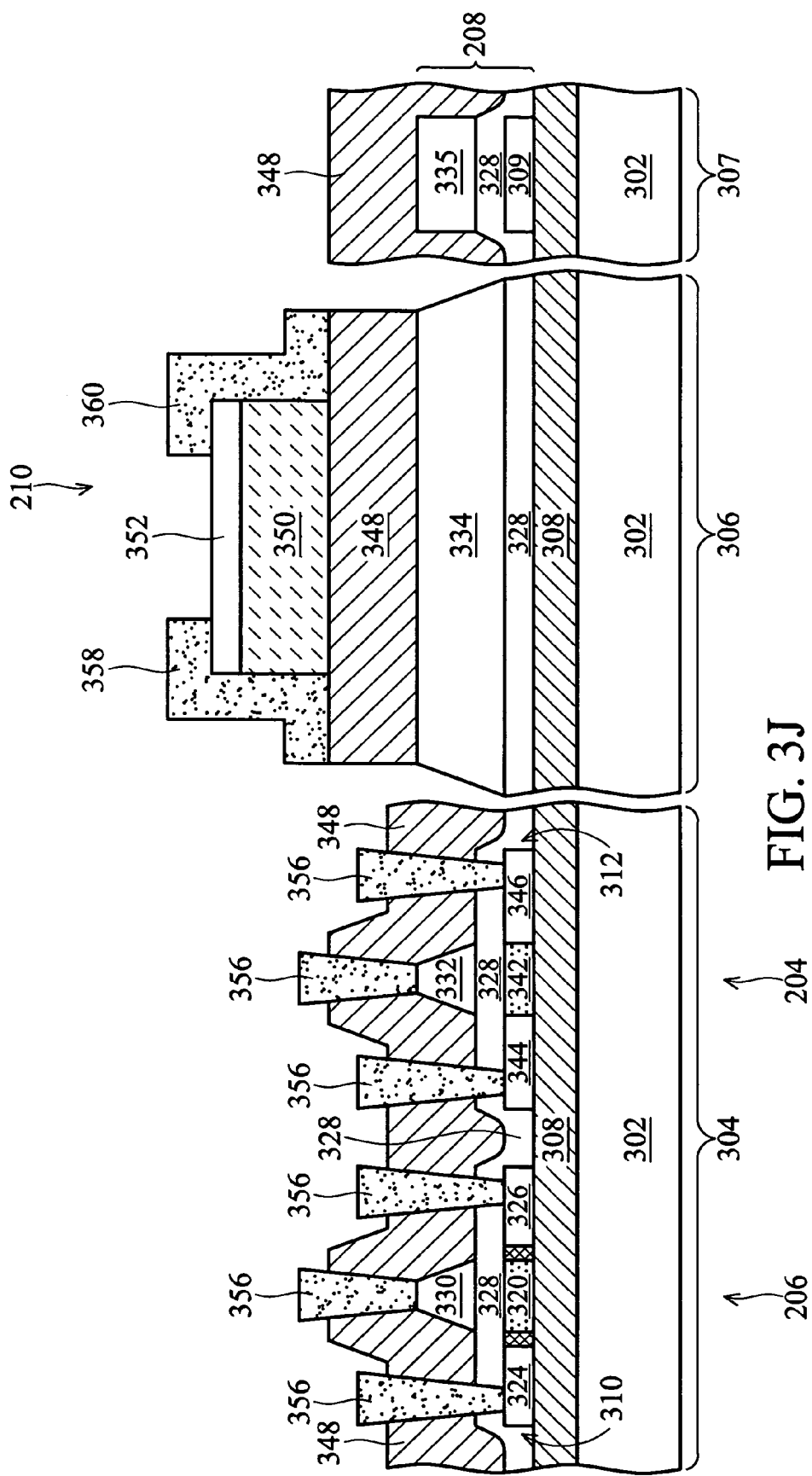

Referring to FIG. 3J, a metal layer (not shown) is blanketly deposited, and then patterned by lithography and etching to form conductive contacts 356 in the openings 354, and form photo sensor source 358 and photo sensor drain 360 on opposite sides of the photo sensor active layer 350 and the photo sensor doped layer 352 in the same step. Thus, the photo sensor 210 as shown in FIG. 2 is formed. In this embodiment, the photo sensor 210 can be a transistor, for example, a bottom gate transistor.

According to some embodiments of the present invention, the switch device, the driving device, and the photo sensor can have gates of the same layer. For example, referring to FIG. 3J, the gate 330 of the switch device 206, the gate 332 of the driving device 204, and the gate 334 of the photo sensor 210 are of the same layer.

Figure 3K:
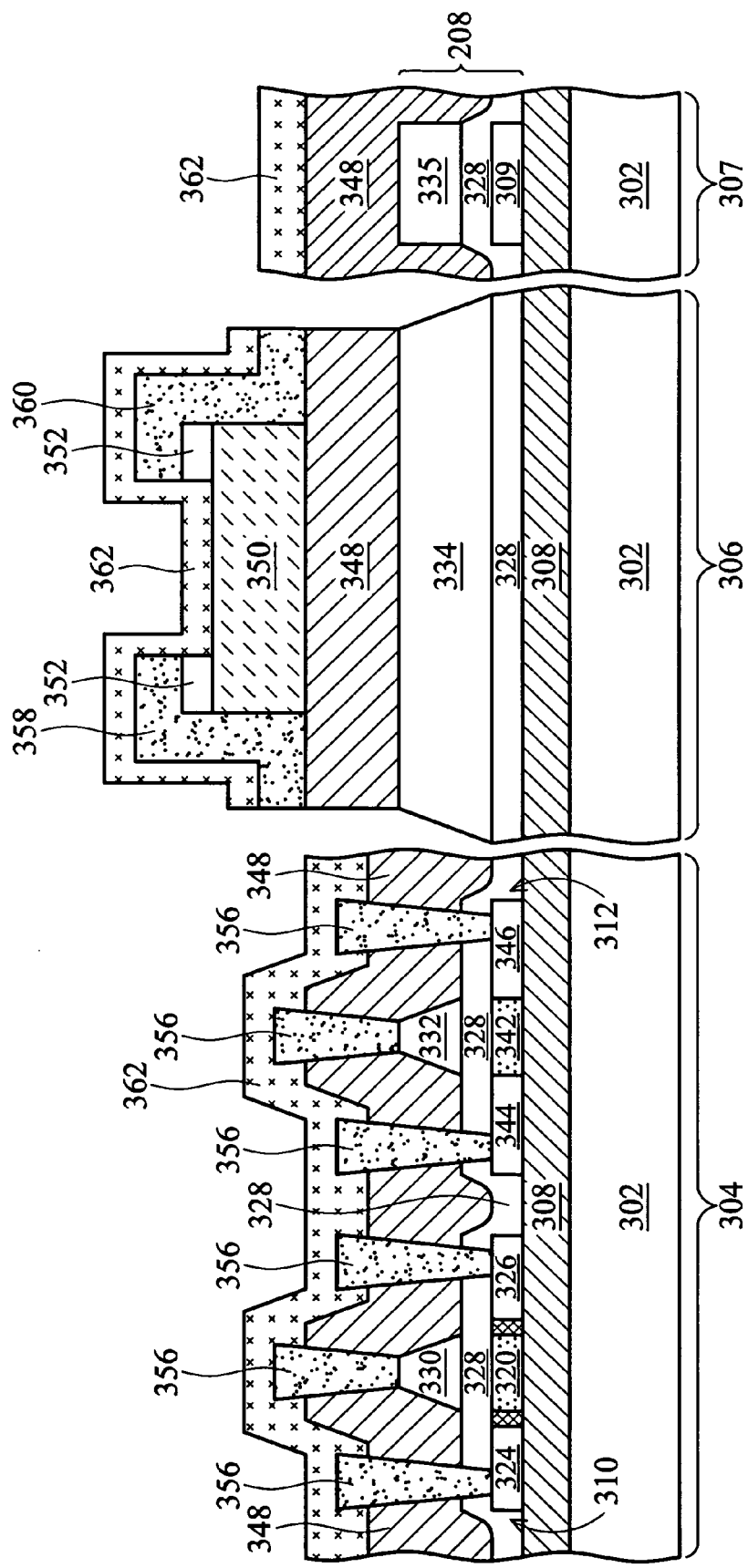

Referring to FIG. 3K, a passivation layer 362, for example silicon nitride or silicon oxynitride, is formed on the conductive contacts 356, the dielectric layer 348, the photo sensor source 358 and the photo sensor drain 360. Preferably, the passivation layer 362 is silicon nitride with a thickness of about 1000 Å~5000 Å.

Figure 3L:
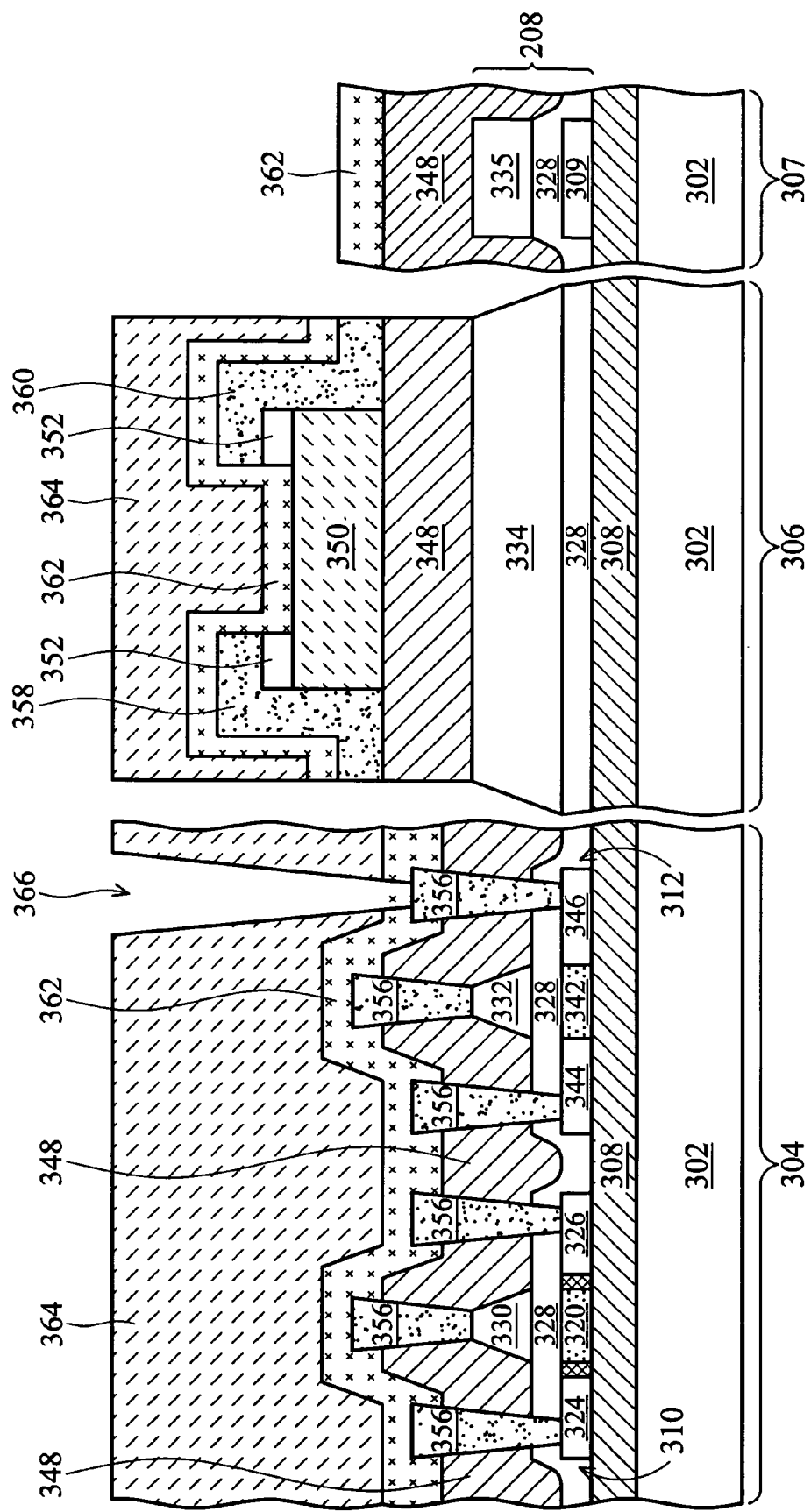

Referring to FIG. 3L, a planarization layer 364 for example organic or oxide, is formed on the passivation layer 362. Preferably, the planarization layer 364 is about 10000 Å~50000 Å thick. The planarization layer 364 and the passivation layer 362 is patterned by lithography and etched to form contact openings 366 corresponding to the conductive contacts 356. In a preferred embodiment of the invention, the conductive opening 366 exposes the conductive contact 356 of the drain 346 of the p type transistor.

Figure 3M:
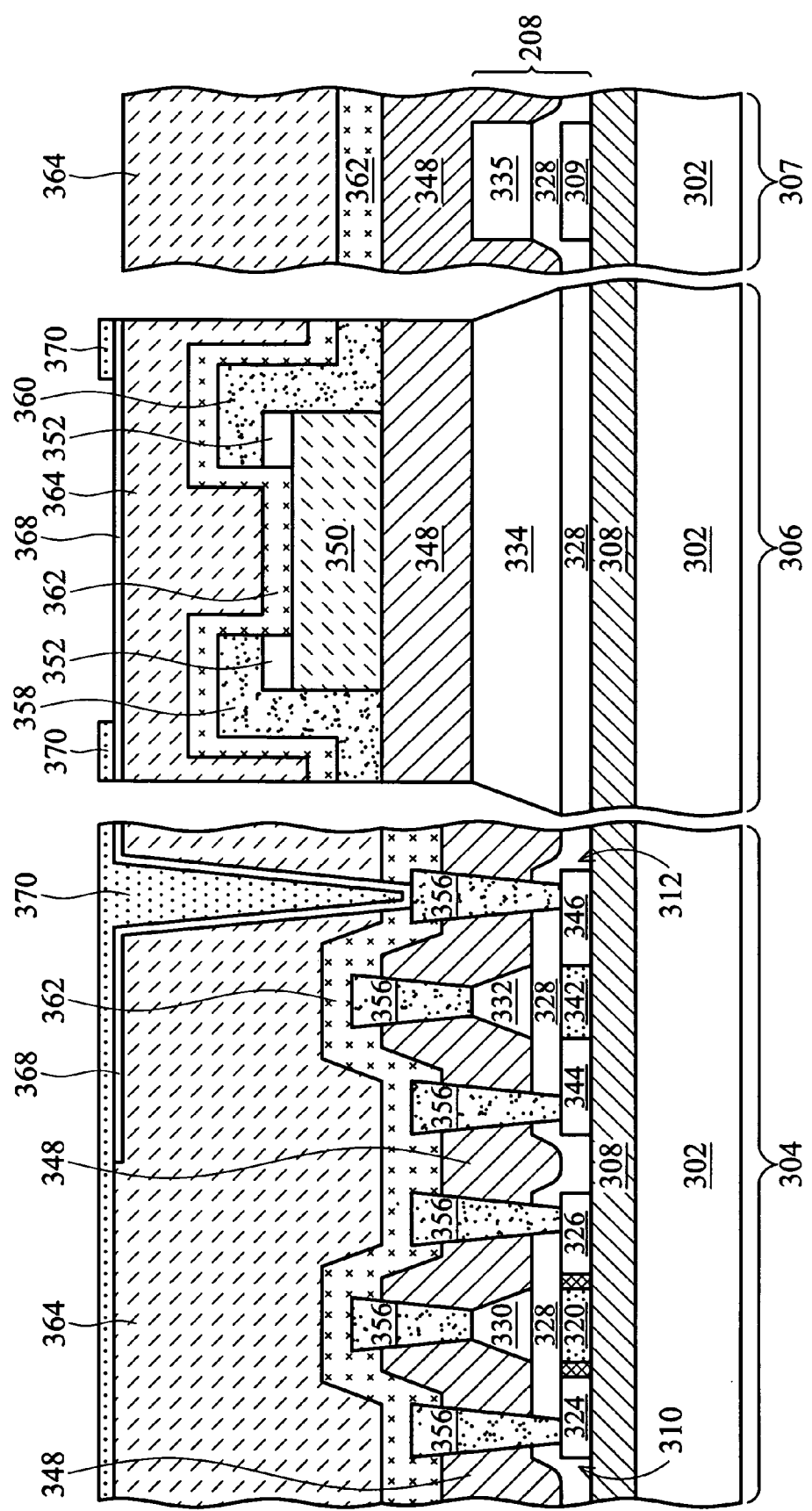
Figure 3N:
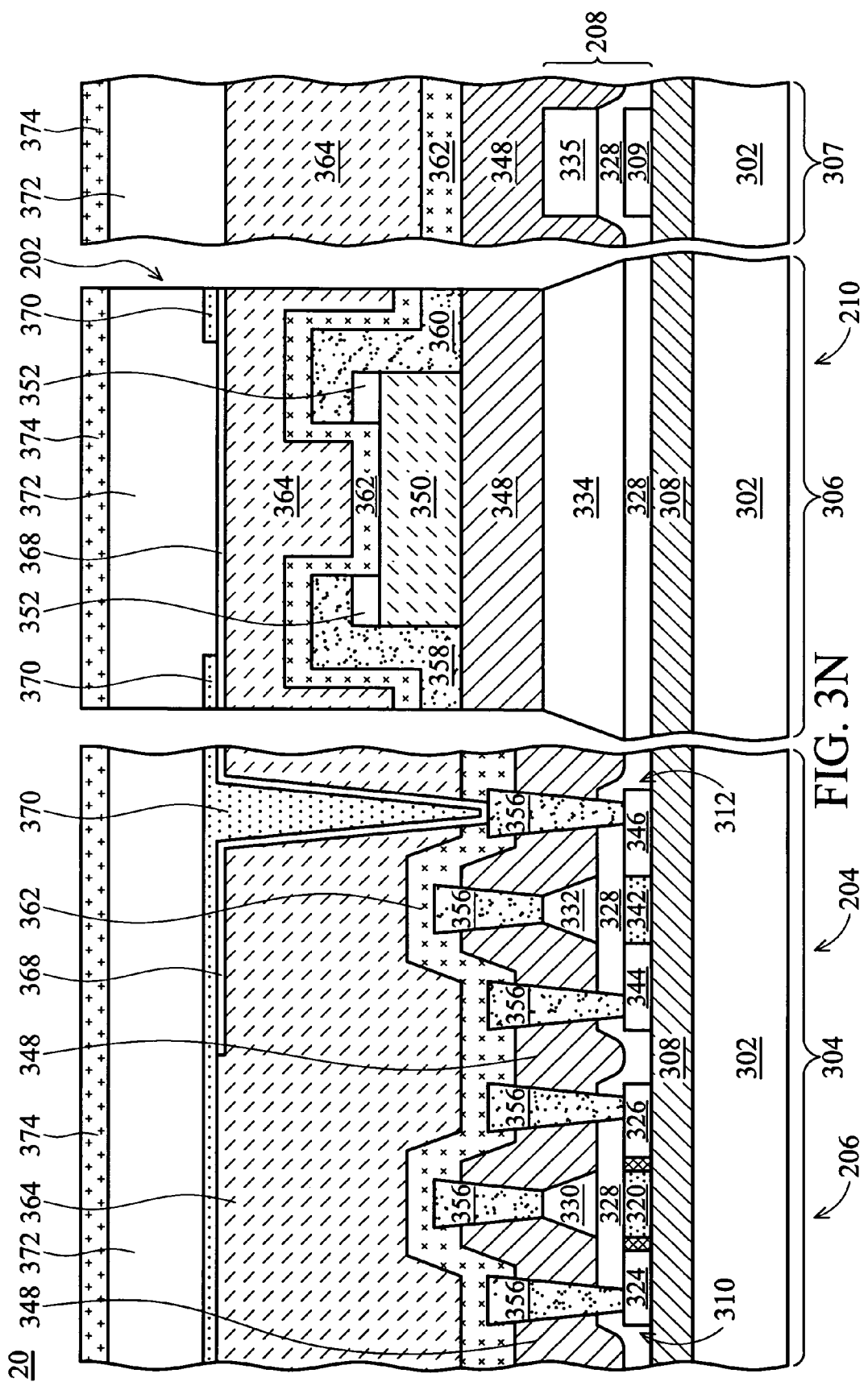

Referring to FIG. 3M, a pixel electrode layer 368 (serving as an anode), for example indium tin oxide (ITO), is formed on the planarization layer 364, electrically connecting the conductive contacts 356. Next, a pixel definition layer 370, for example organic or oxide, is formed on a portion of the planarization layer 364 and the pixel electrode layer 368. Specifically, the pixel definition layer 370 exposes a portion of or the entire photo sensor.

Referring to FIG. 3N, an organic light emitting layer 372 is formed overlying the pixel electrode layer 368 and the pixel definition layer 370. In an embodiment of the invention, the organic light emitting layer 372 disposed overlying the pixel electrode layer 368 (also referred to as an anode layer) comprises a hole-injecting layer, a hole-transport layer, an organic luminescent material layer, an electron-transport layer, and an electron-injecting layer sequentially. The anode layer is indium tin oxide (In2O3:Sn, ITO) which has advantages of facile etching, low film-formation temperature and low resistance. When a bias voltage is applied to the OLED element, an electron and a hole passing through the electron-transport layer and the hole-transport layer respectively enter the organic luminescent material layer to combine as an exciton and then release energy to return to ground state. Particularly, depending on the nature of the organic luminescent material, the released energy presents different colors of light including red (R), green (G) and blue (B).

A cathode 374 is formed on the organic light emitting layer 372. The cathode 374 can be a reflective layer, for example Al, Ag or other suitable material with high reflectivity. Thus, the pixel electrode layer 368, the organic light emitting layer 372, and the cathode 374 constitute the organic electroluminescent element (OLED element) 202 as shown in FIG. 2. A bottom emission organic electroluminescent device is thus formed.

Figure 4:
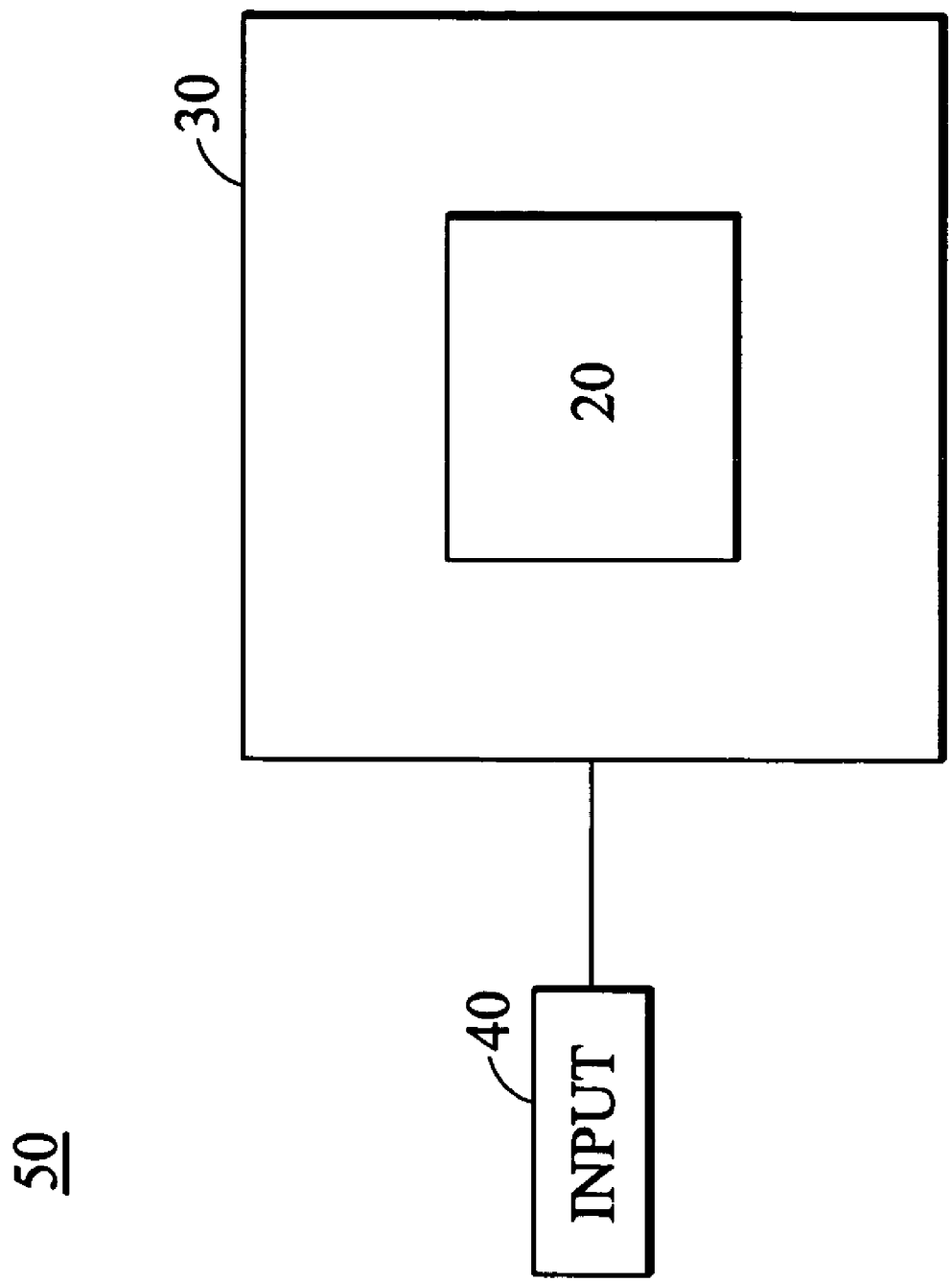
FIG. 4 shows a pixel element incorporated into a panel.

As shown in FIG. 2 and FIG. 3N, according to some embodiments of the invention, photo current is generated in the photo sensor 210 when OLED element 202 illuminates on the photo sensor 210. The level of photo current depends on the brightness of the OLED element 202. Consequently, the voltage of the capacitor 208 coupled to the driving device 204 is adjusted to control the current passing through the driving device 204 according to illumination of the organic electroluminescent element 202 detected by the photo sensor 210. Thus, illumination of the organic electroluminescent element 202 is changed for compensation. Therefore, after aging, brightness uniformity of the OLED element can be improved by such internal compensation. In this regard, FIG. 4 shows that a pixel element, such as the pixel element 20 shown in FIG. 2 or FIG. 3N, can be incorporated into a panel (in this case, panel 30) that can be an OLED panel. The panel can form a portion of a variety of electronic devices (in this case, electronic device 50). Generally, the electronic device 50 comprises the OLED panel 30 and an input unit 40. Further, the input unit 40 is operatively coupled to the OLED panel 30 and provides input signals (e.g., an image signal) to the panel 30 to generate images. The electronic device can be a PDA (personal data assistant), notebook computer, tablet computer, cellular phone, car TV, or digital camera, for example. While the invention has been described by way of example and in terms of preferred embodiments, it is to be understood that the invention is not limited thereto. The scope of the appended claims should be accorded the broadest interpretation so as to encompass all modifications and similar arrangements.

What is claimed is:

1. An organic electroluminescent device, comprising:
a pixel element comprising:
   a substrate comprising a control area and a sensitive area;
   a switch device and a driving device overlying the control area;
   a photo sensor overlying the sensitive area;
   an OLED element disposed in the sensitive area and operative to illuminate the photo sensor; and
   a capacitor coupled to the photo sensor and the driving device;
wherein a photo current corresponding to a brightness of the OLED element is generated by the photo sensor responsive to the OLED element illuminating the photo sensor such that a the voltage of the capacitor is adjusted by the photo current to control the current passing through the driving device, thus changing the illumination of the OLED element,
wherein the switch device and the driving device are top gate transistors, and the photo sensor is an amorphous silicon bottom gate transistor.

2. The organic electroluminescent device as claimed in claim 1, wherein the pixel element is formed of multiple layers, and the switch device, the driving device, and the photo sensor have gates located in the same one of the layers.

3. The organic electroluminescent device as claimed in claim 1, further comprising:
a first active layer disposed in the switch device;
a second active layer disposed in the driving device; and
a gate dielectric layer disposed overlying the first and second active layers and the sensitive area.

4. The organic electroluminescent device as claimed in claim 3, further comprising:
first and second gates disposed on the gate dielectric layer overlying the control area, wherein the first gate is in the switch device, and the second gate is in the driving device; and
a third gate disposed on the gate dielectric layer overlying the sensitive area, wherein the first, second, and third gates are of the same layer.

5. The organic electroluminescent device as claimed in claim 4, further comprising:
a dielectric layer at least covering the first, second, and third gates; and
a third active layer disposed overlying a portion of the dielectric layer overlying the sensitive area.

6. The organic electroluminescent device as claimed in claim 5, further comprising:
a photo sensor doped layer disposed overlying the third active layer; and
a photo sensor source and a photo sensor drain electrically connecting opposite sides of the photo sensor doped layer respectively.

7. The organic electroluminescent device as claimed in claim 3, wherein the dielectric layer further comprises a plurality of openings, exposing the first and second gates and a portion of the first and second active areas, and the openings are filled with conductive contacts.

8. The organic electroluminescent device as claimed in claim 7, further comprising:
- a passivation layer disposed overlying the conductive contacts, the dielectric layer, the photo sensor source and the photo sensor drain; and
- a planarization layer disposed overlying the passivation layer and underlying the photo sensor.

9. The organic electroluminescent device as claimed in claim 8, further comprising:
- a first electrode overlying the planarization layering layer;
- an organic light emitting layer disposed on the first electrode; and
- a second electrode disposed overlying the organic light emitting layer, wherein the first electrode, the organic light emitting layer and the second electrode forms together the OLED element.

10. The organic electroluminescent device as claimed in claim 1, further comprising:
- a display panel, wherein the pixel element is arranged in an array of pixel elements of the display panel.

11. The organic electroluminescent device as claimed in claim 10, further comprising:
- an input unit coupled to the display panel and operative to provide input to the display panel such that they display panel displays images.

12. The organic electroluminescent device as claimed in claim 10, further comprising:
- means for providing input to the display panel.

13. The organic electroluminescent device as claimed in claim 10, wherein the display panel is a portion of an electronic device.

14. The organic electroluminescent device as claims in claim 1, wherein the switch device has a first active layer, the driving device has a second active layer, and the photo sensor has a third active layer,
- wherein the second active layer and the third active layer are formed in different levels.

15. The organic electroluminescent device as claims in claim 1, wherein the switch device has a first active layer, the driving device has a second active layer, and the photo sensor has a third active layer,
- wherein the second active layer and the third active layer are of different materials.

16. The organic electroluminescent device as claimed in claim 15, wherein the second active layer is a polysilicon layer, and the third active layer is an amorphous silicon layer.

17. The organic electroluminescent device as claimed in claim 16, wherein the first active layer is a polysilicon layer.

18. An organic electroluminescent device, comprising:
- a substrate comprising a control area and a sensitive area;
- a switch device and a driving device overlying the control area;
- a photo sensor overlying the sensitive area; and
- an OLED element disposed in the sensitive area and operative to illuminate the photo sensor;
- a capacitor coupled to the photo sensor and the driving device;
- wherein a photo current corresponding to a brightness of the OLED element is generated in the photo sensor responsive to the OLED element illuminating on the photo sensor such that a the voltage of the capacitor is adjusted by the photo current to control the current passing through the driving device, thus changing the illumination of the OLED element,
- wherein the switch device is a top gate transistor, and the photo sensor is a bottom gate transistor.

19. A method for forming an organic electroluminescent device, comprising:
- providing a substrate comprising a control area and a sensitive area;
- forming an active layer overlying the control area of the substrate;
- forming a gate dielectric layer overlying the active layer and the sensitive area of the substrate;
- forming a conductive layer on the gate dielectric layer;
- patterning the conductive layer to form first and second gates in the control area, and a third gate in the sensitive area;
- forming a dielectric layer at least covering the first, second, and third gates;
- forming a photo sensor active layer on a portion of the dielectric layer overlying the sensitive area;
- forming a photo sensor doped layer on the photo sensor active layer;
- forming a photo sensor source and a photo sensor drain electrically connecting opposite sides of the photo sensor doped layer respectively; and
- forming an OLED element overlying a portion of the control area and the sensitive area.

* * * * *